United States Patent
Bodnar et al.

(10) Patent No.: US 10,541,702 B1
(45) Date of Patent: Jan. 21, 2020

(54) AUXILIARY INPUT FOR ANALOG-TO-DIGITAL CONVERTER INPUT CHARGE

(71) Applicant: Analog Devices Global Unlimited Company, Hamilton (BM)

(72) Inventors: Rares Andrei Bodnar, Berkshire (GB); Christopher Peter Hurrell, Cookham (GB)

(73) Assignee: Analog Devices Global Unlimited Company, Hamilton (BM)

( * ) Notice: Subject to any disclaimer, the term of this patent is extended or adjusted under 35 U.S.C. 154(b) by 0 days.

(21) Appl. No.: 16/142,964

(22) Filed: Sep. 26, 2018

(51) Int. Cl.
  *H03M 1/06* (2006.01)
  *H03M 1/08* (2006.01)
  *H03H 7/06* (2006.01)

(52) U.S. Cl.
  CPC .............. *H03M 1/08* (2013.01); *H03H 7/06* (2013.01)

(58) Field of Classification Search
  CPC ........ H03M 1/08; H03M 1/12; H03M 1/1023; H03M 1/203; H03M 1/207; H03H 7/06
  USPC .................................................. 341/118, 155
  See application file for complete search history.

(56) References Cited

U.S. PATENT DOCUMENTS

| | | | |
|---|---|---|---|
| 6,031,480 A * | 2/2000 | Soenen ............... | H03F 3/45479 330/9 |
| 6,366,230 B1 | 4/2002 | Zhang et al. | |
| 6,369,729 B1 * | 4/2002 | Srinivasan ............. | H03M 3/32 341/143 |
| 6,697,006 B1 | 2/2004 | Mccartney et al. | |
| 8,199,859 B2 | 6/2012 | Zerbe et al. | |
| 8,462,030 B2 * | 6/2013 | Muhammad .......... | H03M 3/392 341/143 |
| 8,576,002 B2 | 11/2013 | Rajasekhar | |
| 8,803,721 B1 * | 8/2014 | Boles .................... | H03M 1/164 341/150 |
| 8,941,789 B2 * | 1/2015 | Yoo ..................... | G02F 1/13624 349/129 |
| 8,994,564 B2 | 3/2015 | Hurrell et al. | |
| 9,571,118 B1 | 2/2017 | Gupta et al. | |
| 2004/0160351 A1 * | 8/2004 | Rossi ..................... | H03F 3/005 341/161 |
| 2005/0035810 A1 * | 2/2005 | Mulder ................ | H03K 17/002 327/408 |
| 2006/0172783 A1 * | 8/2006 | Leung ............... | H02M 3/33515 455/572 |

(Continued)

*Primary Examiner* — Jean B Jeanglaude
(74) *Attorney, Agent, or Firm* — Schwegman Lundberg & Woessner, P.A.

(57) ABSTRACT

Input stages for an analog to digital converter wherein charge for charging parasitic capacitances in the input stage, and particularly in the input switch is sourced from a node which means that it does not have to pass through the input RC filter. This has the effect that the input RC filter can be of lower bandwidth, and/or have a larger resistor value, with the consequent result that there is lower power dissipation in the ADC drive circuitry. In one example this effect is realized by providing a separate input into which charge to charge the parasitic capacitances can be fed from external circuitry. In another example an operational amplifier having high (ideally infinite) input impedance can be used to feed charge to the input switch from the input to the RC filter, or from the node between the resistor and capacitor of the filter, again without unsettling the filter.

20 Claims, 9 Drawing Sheets

(56) References Cited

U.S. PATENT DOCUMENTS

| | | |
|---|---|---|
| 2008/0180136 A1 | 7/2008 | Wu et al. |
| 2012/0075133 A1* | 3/2012 | Guinea Trigo ......... H03M 3/45 341/143 |
| 2015/0163747 A1* | 6/2015 | Chen ...................... H04B 1/109 455/78 |
| 2017/0077803 A1 | 3/2017 | Stulik |

* cited by examiner

AUXILIARY INPUT FOR ANALOG-TO-DIGITAL CONVERTER INPUT CHARGE

FIELD OF THE DISCLOSURE

The disclosure relates to the provision of circuitry to charge non-linear capacitances in the input stage of an analog-to-digital converter (ADC), and in particular to circuitry that allows the charging of the non-linear capacitances whilst allowing the charge to bypass any band limiting filter located at the input of the input stage.

BACKGROUND

An analog-to digital converter (ADC) typically comprises, for each channel to be sampled, an input switch, and a sampling capacitor onto which the signal to be converted is sampled via the switch. In order to limit the amount of noise in the sampled signal it is usual to include a band-limiting RC filter at the input of the ADC channel between the input node and the input switch. Ideally, the bandwidth of the RC filter would match that of the desired signal being sampled, but in practice this has not proven to be possible whilst also allowing acceptably short settling times for the ADC. This is because the components of the ADC introduce various non-linear parasitic capacitances, particularly in the back gates of the input switch, which require charging sufficiently to allow for stable signal acquisition.

In order to allow for sufficiently quick ADC operation given the finite charge time of these parasitic capacitances, a broader bandwidth RC filter must be employed, to allow charge to pass quickly enough to the parasitic capacitances from the input node to allow them to settle quickly enough for the desired sampling rate. For example, in one known ADC available from the present Applicant (the LTC2387-18), a RC filter bandwidth of 77 MHz is required in order to sample a 50 kHz signal. This large bandwidth significantly increases the sampled noise, which in many cases leads to high power dissipation in the ADC drive circuitry.

SUMMARY OF THE DISCLOSURE

Examples of the present disclosure relate to input stages for an analog to digital converter wherein charge for charging parasitic capacitances in the input stage, and particularly in the input switch is sourced from a node which means that it does not have to pass through the input RC filter. This has the effect that the input RC filter can be of lower bandwidth, and/or have a larger resistor value, with the consequent result that there is lower power dissipation in the ADC drive circuitry. In one example this effect is realized by providing a separate input into which charge to charge the parasitic capacitances can be fed from external circuitry. In another example an operational amplifier having high (ideally infinite) input impedance can be used to feed charge to the input switch from the input to the RC filter, or from the node between the resistor and capacitor of the filter, again without unsettling the filter.

In more detail, in one example an input stage for a signal processing block including an analog-to-digital converter (ADC) is provided, the input stage comprising a first input node, an RC filter at its input node, and an input switch receiving an input signal to be converted at the input node, provided from the input node via the RC filter. The input stage further includes a second input node separate from the first input node, and first circuitry that is arranged in use to drive one or more internal loads via the second input node. The nature of the internal loads is such that they would otherwise corrupt the input signal if driven from the first input node. For example, the internal loads may be reactive loads or resistive loads, and in particular may be capacitive loads.

In one example the first circuitry provides charge via the second input node to the one or more internal loads in the input switch on at least transition from conversion phase to acquisition phase of the ADC, and/or during at least the acquisition phase of the ADC.

In one example the first input node is connected to a first input pin provided on an integrated circuit package, and the second input node is connected to a second input pin on the integrated circuit package. This is particularly possible on modern IC packaging arrangements which are not pin constrained, for example where the integrated circuit package comprises a ball grid array type package.

In one example the one or more internal loads are one or more parasitic capacitances, and sufficient charge is routed from the second input node to the parasitic capacitances to charge the parasitic capacitances such that negligible charge is required to be fed to the parasitic capacitances from the first input node via the RC filter. This allows the bandwidth of the RC filter to be smaller than would otherwise be the case if the internal loads were driven only from the first input node via the RC filter.

In one example the input switch is a field effect transistor (FET), and at least one or more of the internal loads is a parasitic capacitance between a back gate of the FET and one or more other electrical nodes in the circuit.

In another example boost circuitry may further be included that is arranged to feed a boost voltage to the input switch during an acquisition phase of the ADC, the boost circuitry providing the boost voltage between the input switch and the second input node. In particular examples the boost circuitry may comprise a boost capacitor, and boost switching circuitry, and the boost switching circuitry operates to: i) during a first phase, to charge the boost capacitor; and ii) during a second acquisition phase of the ADC, connect the boost capacitor between the input switch and the second input node.

In the above particular example, the input switch may be a field effect transistor (FET), and the boost voltage is provided between the gate terminal of the FET and the second input node.

In a further example an input stage for an analog-to-digital converter (ADC) is provided, the input stage comprising a first input node at which in use an input signal to be converted is received, an RC filter, and an input switch receiving the input signal to be converted via the RC filter. The input stage further comprises a second input node separate from said first input node and boost circuitry arranged to feed a boost voltage to the input switch during an acquisition phase of the ADC, the boost circuitry providing the boost voltage between the input switch and the second input node.

In one example the second input node is substantially free of the input signal received at the input node such that the boost voltage is not modulated therewith.

In one example the boost circuitry comprises a boost capacitor, and boost switching circuitry, the boost switching circuitry operating to:
  i) during a conversion or charging phase of the ADC, connect the boost capacitor to a voltage differential to charge the capacitor;

ii) during the acquisition phase of the ADC, connect the boost capacitor between the input switch and the second input node.

In one example the input switch is a field effect transistor (FET), and the boost voltage is provided between the gate terminal of the FET and the second input node.

In a yet further example of the present disclosure an input stage for an analog-to-digital converter (ADC) comprises an input signal line having in series a first input node, a low-pass RC filter, and an input switch, the arrangement of the input signal line being such that in use the input switch receives an input signal to be converted from the input node via the RC filter. The input stage further comprises an amplifier, the amplifier having an input connected at any point on the input signal line between the input node and the input switch, and an output that is used to drive one or more internal loads. The nature of the internal loads is such that they would otherwise corrupt the input signal if driven from the first input node. For example, the internal loads may be reactive loads or resistive loads, and in particular may be capacitive loads, and more particularly parasitic capacitances between the input switch and one or more other electrical nodes in the circuit.

In one example the amplifier is an operational amplifier having a high input impedance, and the input switch is a field effect transistor (FET). At least one or more of the parasitic capacitances are parasitic capacitances between a back gate of the FET and one or more other electrical nodes in the circuit. In a further example an input stage for an analog-to-digital converter (ADC) is provided, the input stage comprising an input signal line having in series a first input node, a low-pass RC filter, an input switch, and a sampling capacitor, the arrangement of the input signal line being such that in use the input switch receives an input signal to be converted from the input node via the RC filter and outputs the input signal to the sampling capacitor to be sampled for digital conversion, the input stage further comprising a second input node separate from the first input node, and first circuitry connecting the second input node to the sampling capacitor, the arrangement being such that the second input node receives in use a pre-charge signal which is used to pre-charge the sampling capacitor without further amplification being applied to said pre-charge signal. With such an arrangement the auxiliary input can also be used to source charge for pre-charging purposes of the sampling capacitor. The auxiliary input can be connected to a low output impedance current source for such purposes, thereby bypassing the need for a voltage follower amplifier on the ADC chip itself connected to the signal line.

The above example may further comprise second circuitry connecting the second input node or a third input node to one or more internal loads in the input switch on at least transition from conversion phase to acquisition phase of the ADC or during acquisition phase of the ADC, the internal loads being such that they would otherwise corrupt the input signal if driven from the first input node. As such, current for both pre-charging the sampling capacitor and on-biasing (i.e. gate boosting) the input switch can both be sourced from appropriate current sources located off chip, and without requiring the current for each to perturb the RC filter at the ADC input.

Further features, examples, and advantages of the present disclosure will be apparent from the following description and from the appended claims.

BRIEF DESCRIPTION OF THE DRAWINGS

Examples of the present disclosure will now be described with reference to the accompanying drawings, wherein like reference numerals refer to like parts, and wherein:—

DETAILED DESCRIPTION

The input switch to a sampling capacitor in an analog-to digital converter (ADC) absorbs a significant amount of charge during transition to acquisition phase of the ADC or during acquisition phase, due to the non-linear capacitances in its back gate. Conventionally this charge is provided to the input switch from the input Vin via the input RC filter provided at the input to the ADC, which means, in order to provide fast settling times for these parasitic charges, a large bandwidth RC filter is required, which in turn increases the sampled noise.

In order to address this problem, instead of charging the non-linear capacitances in the switch via the RC filter, a separate secondary input is provided in order to take charge from a current source to charge all of the parasitic capacitances in the input switch without the charge having to go through the input RC filter. This allows a lower bandwidth filter or larger resistor value, leading to lower sampled noise. Physically in one example the additional input may manifest itself on the ADC chip as an additional input pin, which is not an issue with modern ball-grid array chip packaging technology allowing many possible pins when compared with traditional DIL packaging. In another example the charge may be generated by an operational amplifier connected directly to VIN before the RC filter, or to the node between the resistor and capacitor of the RC filter.

Figure 1:
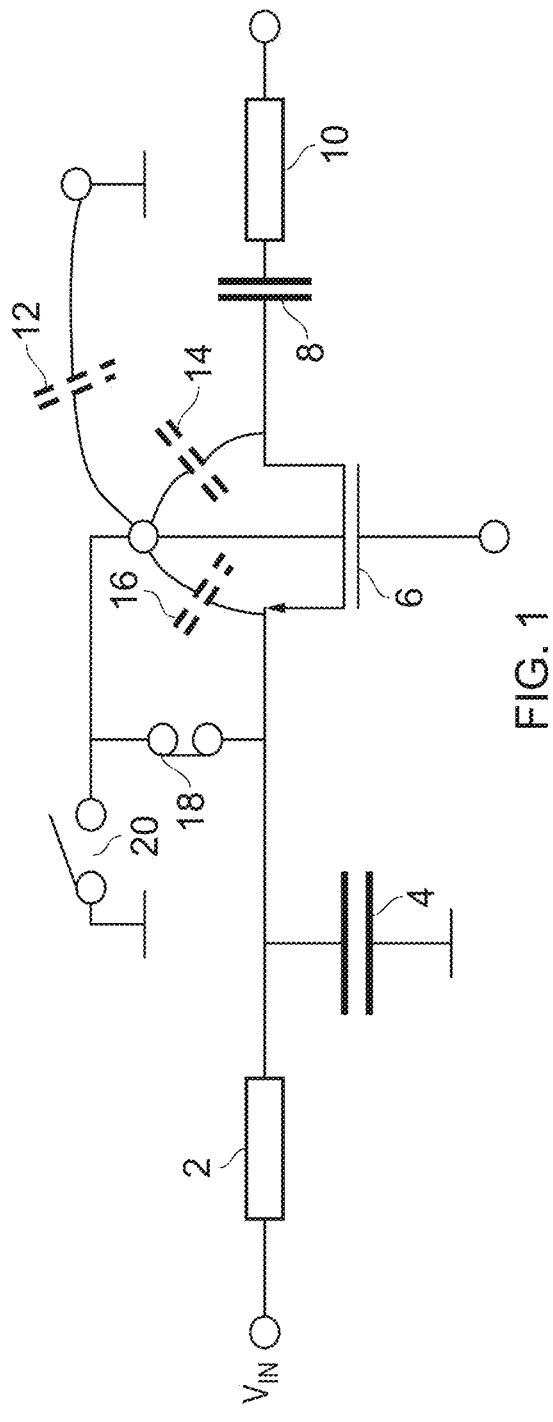
FIG. 1 is a diagram of a typical ADC input stage illustrating the parasitic capacitances present in the back gates of the input switch.

FIG. 1 shows a simplified typical ADC input stage. An ADC input stage typically comprises an input node VIN at which an analog signal to be sampled is input. An RC input stage comprising resistor 2 in series with the input VIN and capacitor 4 connected between the resistor and ground is also provided, the resulting RC filter acting to band limit the input signal thus reducing the noise that is sampled. The node between the resistor and capacitor is then connected to the source terminal of the input switch 6, typically being a FET. Connected to the drain terminal of the input switch 6 is the sampling capacitor 8, onto which the signal to be digitised is sampled and held during acquisition. A resistor 10 is connected to the opposite plate of the sampling capacitor 10, with the remaining conversion circuitry of the ADC being conventional and not shown.

The input switch 6 is typically a dual gate FET having front and back gates. Non-linear parasitic capacitances arise within the device, particularly in the back gate between the gate and output nodes of the FET. These are shown as parasitic capacitances 12, 14, and 16 in FIG. 1. The back gate of the FET is connected to the input line via switch 18, and to ground via switch 20. During acquisition switch 18 is closed and switch 20 is open; during conversion switch 18 is open and switch 20 is closed.

The basic operation of an ADC alternates between two modes; acquisition of the signal to be sampled, and conversion of the acquired signal. During acquisition the input switch is turned on to allow current from the input VIN to flow through the input switch 6 and into the sampling capacitor 8, to bring the voltage held on the sampling capacitor 8 up to the level of the voltage to be sampled at VIN. However, due to the parasitic back gate capacitances, the switch cannot be considered ideal, and some of the input charge is diverted, for example by switch 18, to charge the parasitic capacitances, thus increasing the settling time required to bring the sampling capacitor 8 up to the input level. In order to minimise this settling time, the input RC filter comprising resistor 2 and capacitor 4 is usually designed so as to have a much wider bandwidth than the input signal to be sampled, to allow the parasitic capacitances to be charged as quickly as possible and reduce settling time. However, this wide bandwidth in itself introduces the issue that the driver circuitry for the ADC must supply and dissipate more power than is strictly necessary for the bandwidth of the sampled signal, thus increasing power consumption in the device. There is thus conventionally a trade-off between fast settling times of the ADC but having a wide bandwidth RC filter leading to higher power consumption in the driver, or a lower bandwidth RC filter with lower driver power, but longer settling times (and hence lower sampling rates).

Figure 2:
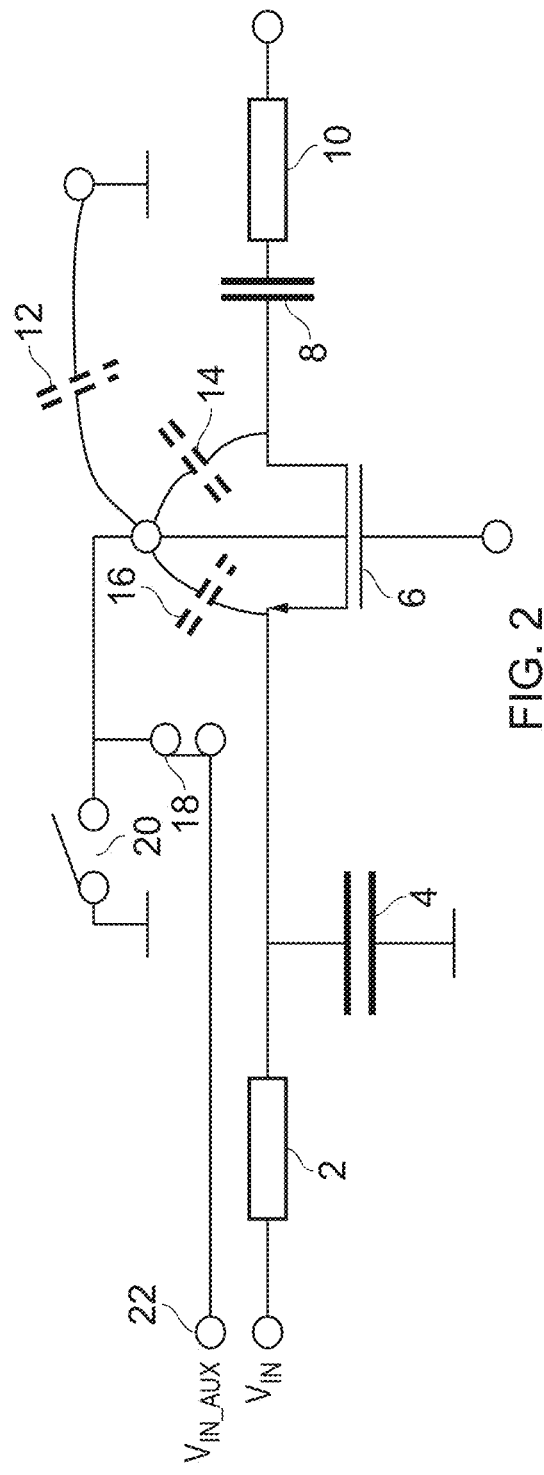
FIG. 2 is a diagram of a first example of the present disclosure, where a separate input is provided into which charge can be supplied to charge the parasitic capacitances.

FIG. 2 illustrates a first simplified example of the present disclosure that addresses the above issue. Specifically, the issue is addressed in this example by providing a secondary input VIN_AUX which can be connected to an external off-chip current source from which current can be provided to charge the back-gate parasitic capacitances on switchover to acquisition. Specifically, the secondary input VIN_AUX is connected via the switch 18 directly to the back gate node 16 of the input switch 6. When the ADC enters acquisition, switch 18 turns on and switch 20 turns off, and current is provided directly from the VIN_AUX secondary input directly to the back gate 16 to charge the parasitic capacitances 12, 14, and 16. The charge current for the parasitic capacitances therefore bypasses the RC filter entirely, and hence the RC filter can be of lower bandwidth, more closely matched to the sampling rate, and hence requiring less driver power.

Figure 3:
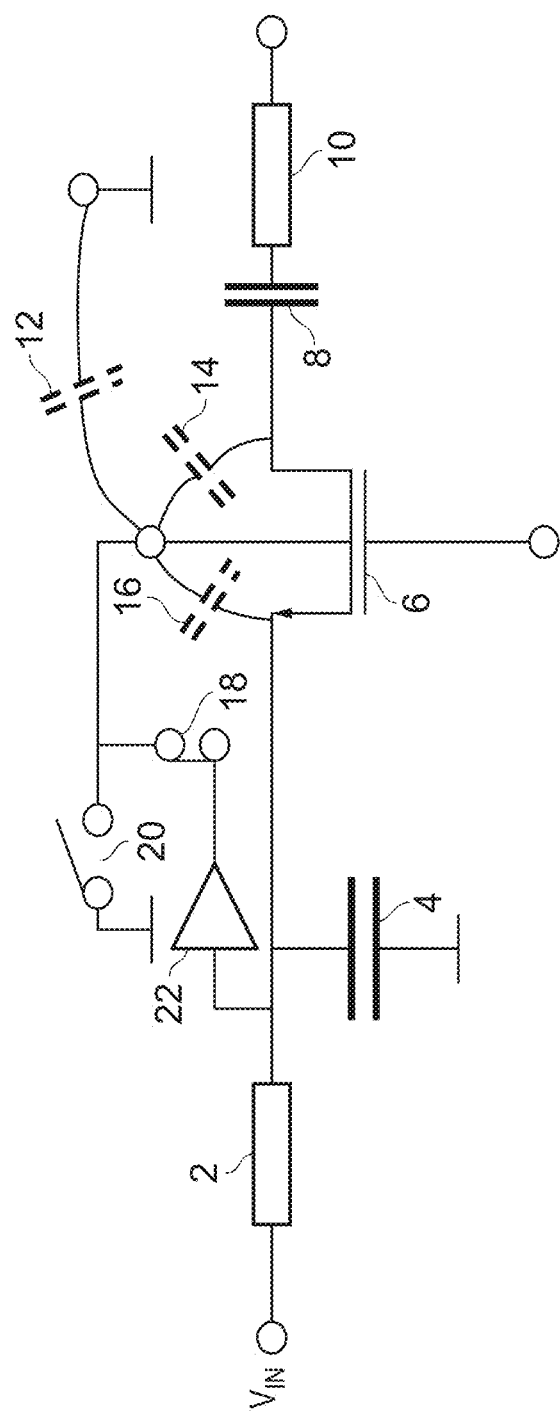
FIG. 3 is a diagram of a second example of the present disclosure, where charge is sourced via an operational amplifier to charge the parasitic capacitances.

FIG. 3 shows a second simplified example, which solves the same problem in a slightly different manner. Here, the switch 18 is connected to the input line via an operational amplifier 22. The input to the operational amplifier 22 is connected to the node between the resistor 2 and capacitor 4 of the RC input filter but could equally be connected to the input node VIN. Given that an ideal operational amplifier is of infinite input impedance (and a real op-amp is of very high input impedance) little or no additional current is drawn through the input VIN into the op-amp, and hence the RC filter can be of lower bandwidth than the arrangement in FIG. 1, more closely matched to the signal to be sampled. The op-amp (the power supply to which is not shown) then supplies the current to charge the parasitic capacitances. Again, therefore, the parasitic capacitance charge current has not been supplied via the RC filter, meaning the filter can again be of lower bandwidth, with the attendant driver power advantages described previously i.e. lower power consumption.

Figure 4:
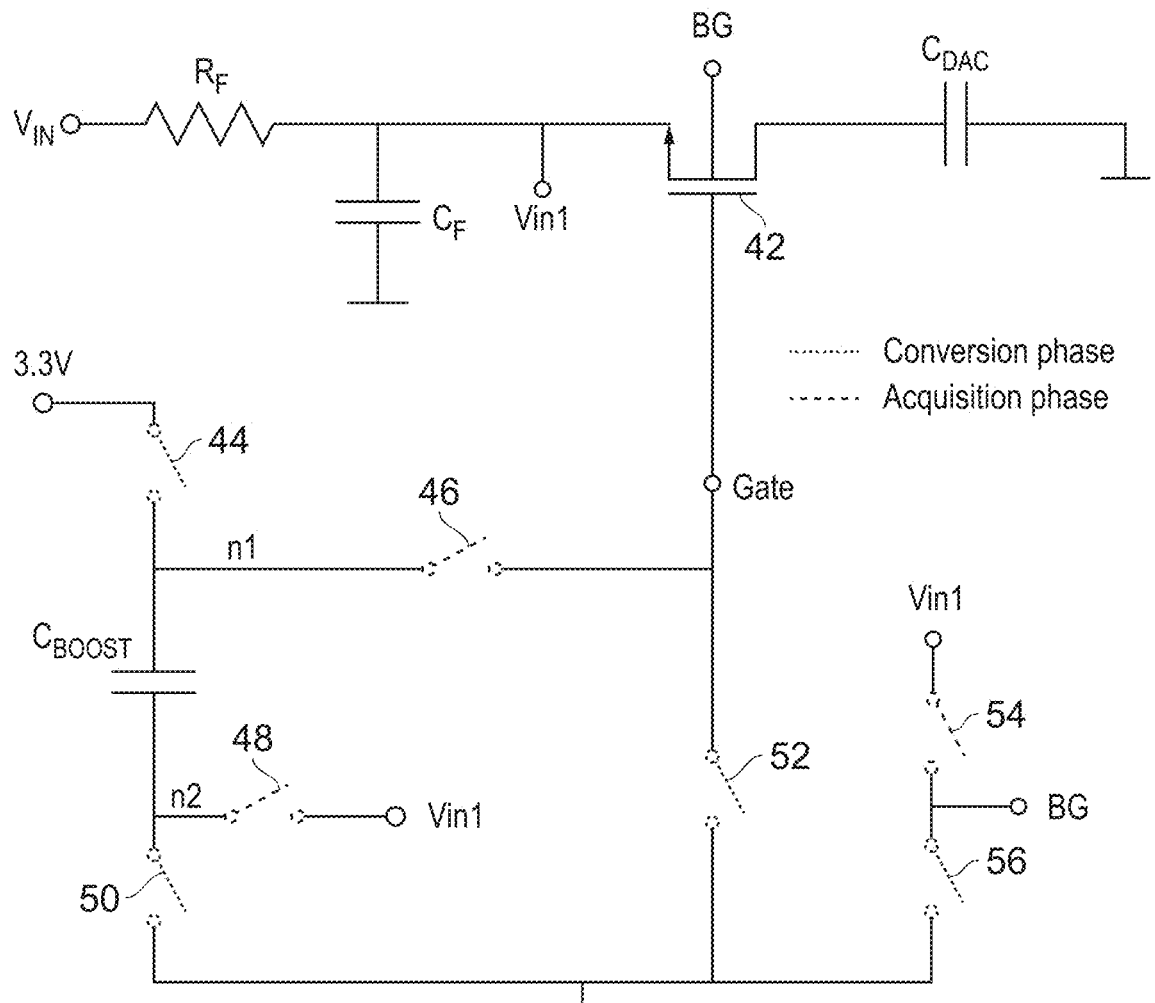
FIG. 4 is a diagram of conventional "gate-boost" circuitry used to ensure fast switch on of the input switch on switchover from conversion to acquisition phase of the ADC.

FIG. 4 illustrates a "gate boosted" ADC input stage, to which the concepts of the present disclosure can be applied. Here, the ADC input stage comprises input RC filter comprising resistor Rf and capacitor Cf arranged as a low pass filter, and input back-gate FET switch 42, which switches an input signal from input Vin via the RC filter onto the sampling capacitor $C_{DAC}$ A "gate boost" circuit is then provided to place a bias voltage across the input switch 42 during the acquisition phase to make the switch response more linear. The gate boost circuit comprises a switch 44 which is closed during the conversion phase, and open during the acquisition phase. The switch 44 is connected between a 3.3 v voltage supply and a first plate of a large capacitor $C_{Boost}$. The second plate of $C_{Boost}$ is connected to ground via switch 50, which is closed during conversion phase and open during the acquisition phase. Also connected to the second plate of $C_{Boost}$ is switch 48, which is controlled to be closed during the acquisition phase, and open during the conversion phase. The other side of switch 48 is connected to the node between the source of the input switch 42 and the RC filter, marked as Vin1.

The first plate of $C_{Boost}$ is connected via switch 46 to the gate node of the input switch, with switch 46 being controlled so as to be closed during the acquisition phase, and open during the conversion phase. Also connected between the gate node of the input switch and ground is a switch 52, which is controlled to be open during the acquisition phase and closed during the conversion phase.

The components of the gate boost circuitry thus far described operate in a manner to be described so as to control the gate-source voltage Vgs of the input switch 42. However, it is also necessary to control the back gate voltage, and this is achieved by the provision of switches 54 and 56. Specifically, switch 54 is connected between the Vin1 node and the back gate node of the switch 42, and switch 56 is connected between the back gate node of switch 42 and the local ground. The two switches 54 and 56 operate in anti-phase i.e. switch 54 is shut during acquisition and open during conversion whereas switch 56 is open during acquisition and closed during conversion.

The operation of the gate boosted input stage is as follows. During the conversion phase switches 44, 50, 52 and 56 switch on, and switches 46, 48 and 54 switch off. This has the effect of isolating the boost capacitor $C_{Boost}$ from the remainder of the circuit and instead connecting it between the VDD power supply (3.3 v) and local ground. As a result, during the conversion phase $C_{Boost}$ is charged to VDD (3.3 v). At the same time both the gate and the back-gate of the input switch 42 are connected to ground, and hence the input switch is firmly turned off. The sampling capacitor is therefore isolated from the input, and conversion can proceed.

After conversion the operation switches over to the acquisition phase. In this phase switches 44, 50, 52, and 56 open, and switches 46, 48, and 54 close. This has the effect of switching the boost voltage held on $C_{Boost}$ across the gate-source junction and hence boosting Vgs, as described previously. At the same time, the opening of switch 56 and the closing of switch 54 connects the back gate of switch 54 to the Vin1 node, and hence charge to charge the parasitic capacitances flows from VIN to Vin1 via the RC filter, giving arise to the problems noted previously with then requiring a wide RC bandwidth.

Figure 5:
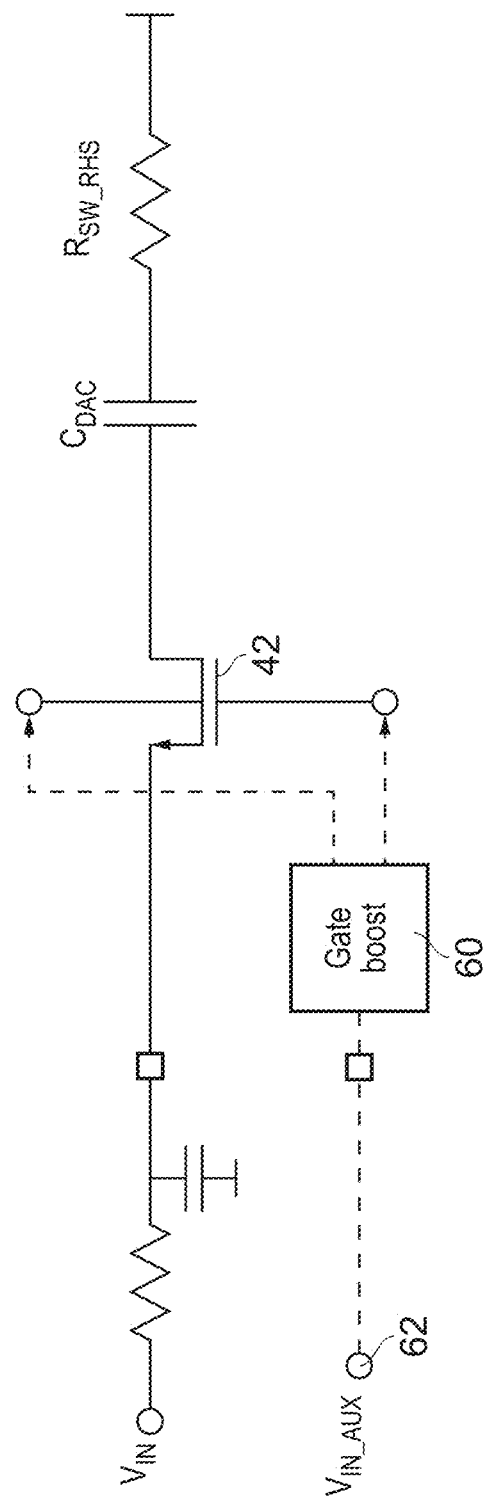
FIG. 5 is a diagram of a third example of the present disclosure, where "gate boost" circuitry has been modified to have a secondary input which bypasses the input RC filter.

In order to address these issues, according to one detailed example of the disclosure, then as shown in FIG. 5 an auxiliary input 62 is provided in order to provide current to the gate boost circuitry 60 whilst bypassing the RC filter. The auxiliary input 62 may be connected, for example, to an off chip power supply so that current may be supplied to the gate boost circuitry via a different circuit path than through the input for the signal to be sampled. In some examples the auxiliary input may be physically manifested as a separate external input to the integrated circuit (IC) implementing the ADC, for example where the IC is packaged in a ball grid array package. At the start of the acquisition phase when the parasitic capacitances in the switch 42 are being charged and the signal is settling the electrical charge for such parasitics can then come from the auxiliary input rather than from the signal input via the RC filter. As a consequence, the bandwidth of the RC filter can be reduced, with attendant reduction in power use in the ADC drive circuitry, as discussed previously.

Figure 6:
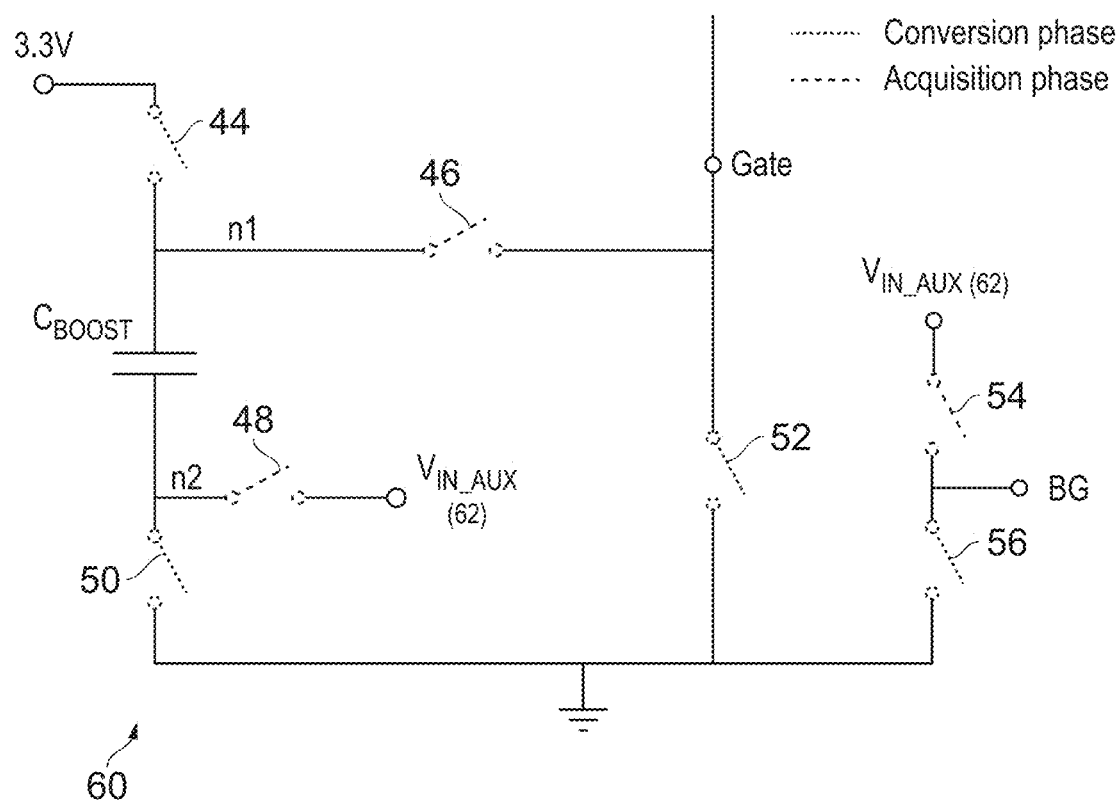
FIG. 6 is a diagram of the modified gate boost circuitry of FIG. 5.

FIG. 6 illustrates a modified gate boost circuit to provide the above. Comparing FIG. 6 to FIG. 4 it will be seen that the circuit layout is the same, with the same arrangement of switches and capacitors as described previously with respect to FIG. 4. However, in the arrangement of FIG. 6 the difference arises that the switches 48 and 54 in FIG. 6 are connected at one end to the auxiliary input VIN_AUX, rather than to Vin1, as in the arrangement of FIG. 4. That is, as shown in FIG. 6, the switch 48 now switches between the bottom plate of capacitor $C_{Boost}$ and the auxiliary input, with the switch being on during acquisition and off during conversion. In addition, the switch 54 is connected between the auxiliary input VIN_AUX and the switch 42 back gate (BG). The significance of these changes is two fold; firstly, the charge to charge the parasitic capacitances in the back gate is sourced, via switch 54, directly from the auxiliary input VIN_AUX, rather than through the RC circuit after VIN, and secondly, the boost capacitor $C_{Boost}$ is switched during acquisition to be connected between the gate terminal of the switch 54 and the auxiliary input, which means that the voltage being supplied by the $C_{Boost}$ to the gate terminal of the FET constituting switch 54 during the acquisition is not modulated by any input signal to be sampled that should also be present on the VIN line. As such, there is no possibility of the Vgs of the switch being modulated by the signal to be sampled to such an extent as to reduce the boost biasing provided by the boost capacitor, and hence the switch 54 can remain biased hard on throughout the entire acquisition phase, thus reducing any modulation distortion that may otherwise be present.

Figure 7:
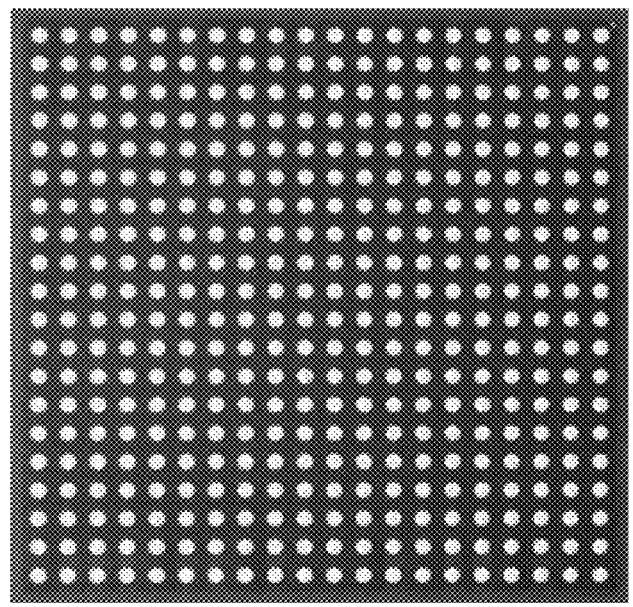
FIGS. 7 and 8 are pictures of ball grid arrays that can be used to provide the secondary input when the examples are implemented in an integrated circuit package.
Figure 8:
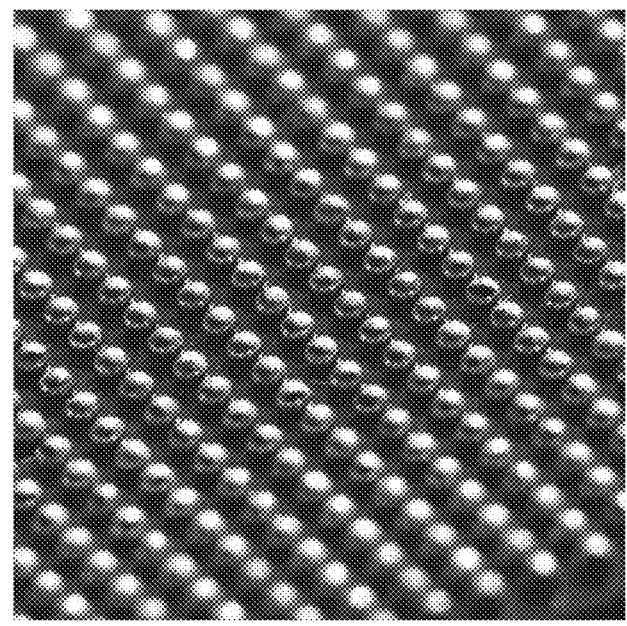

As noted above, in modern IC packaging the use of ball grid arrays as shown in FIGS. 7 and 8 means that there are often plenty of available input pins in the IC packaging. The auxiliary input VIN_AUX 62 may therefore have its own input pin assigned to it i.e. be connected to an input pin in the IC packaging, so that it can be supplied with a voltage separately from the VIN input. Such an arrangement ensures that the charge to charge the parasitic capacitances in the sampling switch back gates is kept off the input channel VIN, with the result that the RC filter can be of narrower bandwidth, as described previously.

In addition to being used to provide current to the input switch of the ADC, the auxiliary input Vin may also be used to supply charge to the sampling capacitor for pre-charge purposes immediately prior to or at the start of the acquisition phase. Pre-charging of the sampling capacitor is known already from our earlier U.S. Pat. No. 8,994,564B2, both in the context of a multiplexed input ADC (ie having a multiplexer on the input, for a single channel ADC). In both cases usually the pre-charge current would be taken from the input line after the RC filter, with the attendant disadvantages described previously that then the RC filter must of wider bandwidth then it should be for ideal noise filtering purposes such that the pre-charge is performed in an acceptably short time. However, we also describe that the input for the pre-charge may be taken from the input line prior to the RC filter, however in either case i.e. whether taken from pre or post the RC filter a voltage follower amplifier is included to act as a pre-charge amplifier and provide an amplified version of the input signal to pre-charge the sampling capacitor. One of the reasons for including the voltage follower amplifier is that typically the input stage in front of the ADC has a high impedance output, and particularly where this is a multiplexer. Such a high impedance output means that the current to pre-charge the sampling capacitor can flow only very slowly, and specifically not quickly enough to allow pre-charge to take place quickly enough for the desired sampling rate from the ADC.

Figure 9:
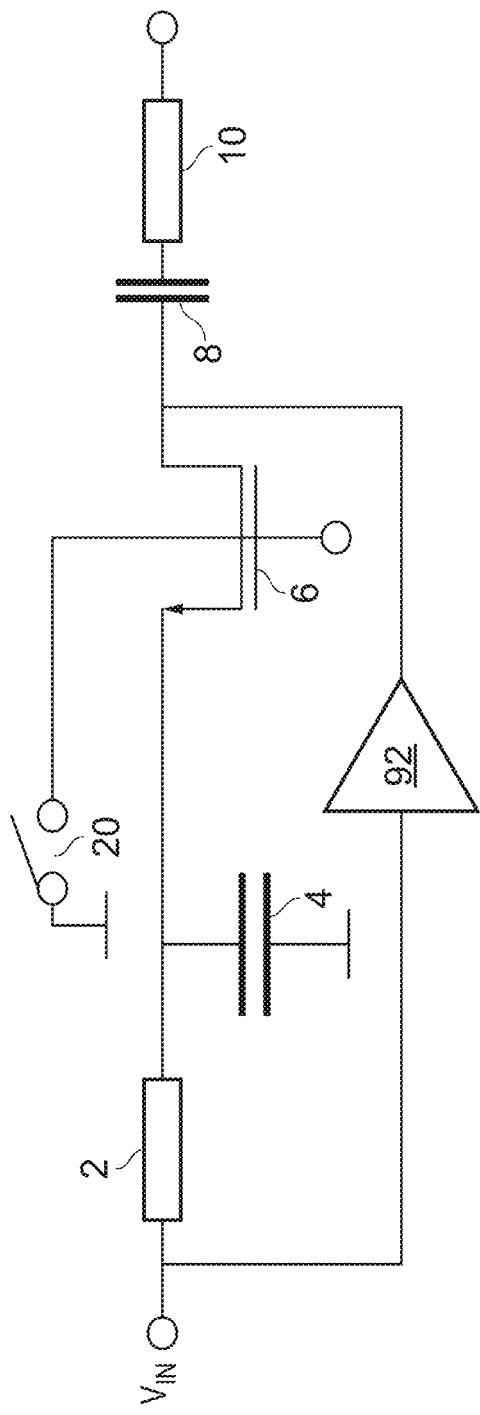
FIG. 9 is a circuit diagram of a pre-charge circuit including a pre-charge amplifier.

FIG. 9 illustrates such a known arrangement. Here, a voltage follower pre-charge amplifier 92 is included which takes its input from the input signal line in front of the RC filter, and outputs a pre-charge signal to the sampling capacitor 8.

One of the problems with such a pre-charge arrangement is the necessity for the pre-charge voltage follower amplifier 92, which can occupy a lot of silicon area on an integrated circuit implementation, and also consume additional power unnecessarily. In order to get around this issue, in the present example of the present disclosure, the pre-charge amplifier is not included and instead the sampling capacitor is connected directly to the AUX_VIN output, via a control switch 94 (typically a FET), as shown in FIG. 10.

Figure 10:
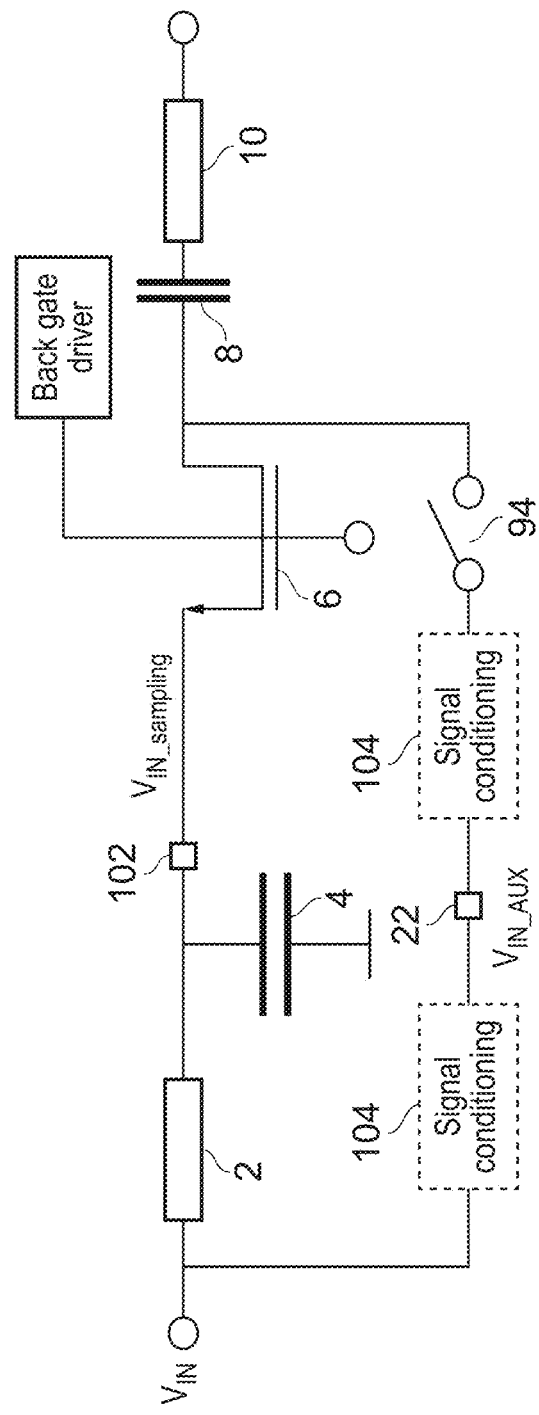
FIG. 10 is a diagram of a pre-charge circuit using an auxiliary input.

In more detail, FIG. 10 shows the input stage of an ADC as described previously, that comprises an input node VIN at which an analog signal to be sampled is input. The ADC input stage comprises an RC filter input stage comprising resistor 2 in series with the input node VIN and capacitor 4 connected between the resistor and ground, the resulting RC filter acting to band limit the input signal thus reducing the noise that is sampled. The RC filter in this example is located off the ADC chip, such that the inputs to the ADC chip are shown as input nodes 22 and 102, labelled VIN_AUX and VIN_SAMPLING respectively. The VIN_SAMPLING node between the resistor and capacitor is then connected to the source terminal of the input switch 6, typically being a FET. Connected to the drain terminal of the input switch 6 is the sampling capacitor 8, onto which the signal to be digitised is sampled and held during acquisition. A resistor 10 is connected to the opposite plate of the sampling capacitor 10, with the remaining conversion circuitry of the ADC being conventional and not shown. Passive signal conditioning circuitry 104 (which may be an RC low pass filter) is included within the auxiliary input signal path, either on chip after VIN_AUX, or off-chip prior to VIN_AUX, to match the signal phase shift between the auxiliary input path through VIN_AUX, and the main input signal path through VIN_SAMPLING.

To provide pre-charge by avoiding the RC filter and not requiring a voltage follower amplifier, however, in this example the auxiliary input VIN_AUX is provided, at which is provided in use a copy of the signal to be sampled, via low impedance drive circuitry (not shown) in the ADC drive circuitry, and the passive signal conditioning circuitry 104 (if located off-chip). The low impedance nature of the drive circuitry allows the sampling capacitor to be pre-charged by the signal to be sampled within the time available for pre-charge whilst maintaining the desired sampling rate, without requiring the voltage follower pre-charge amplifier 92 to be included in the ADC input stage, as in the prior art example of FIG. 9. As a consequence, the ADC input stage is vastly simplified.

Figure 11:
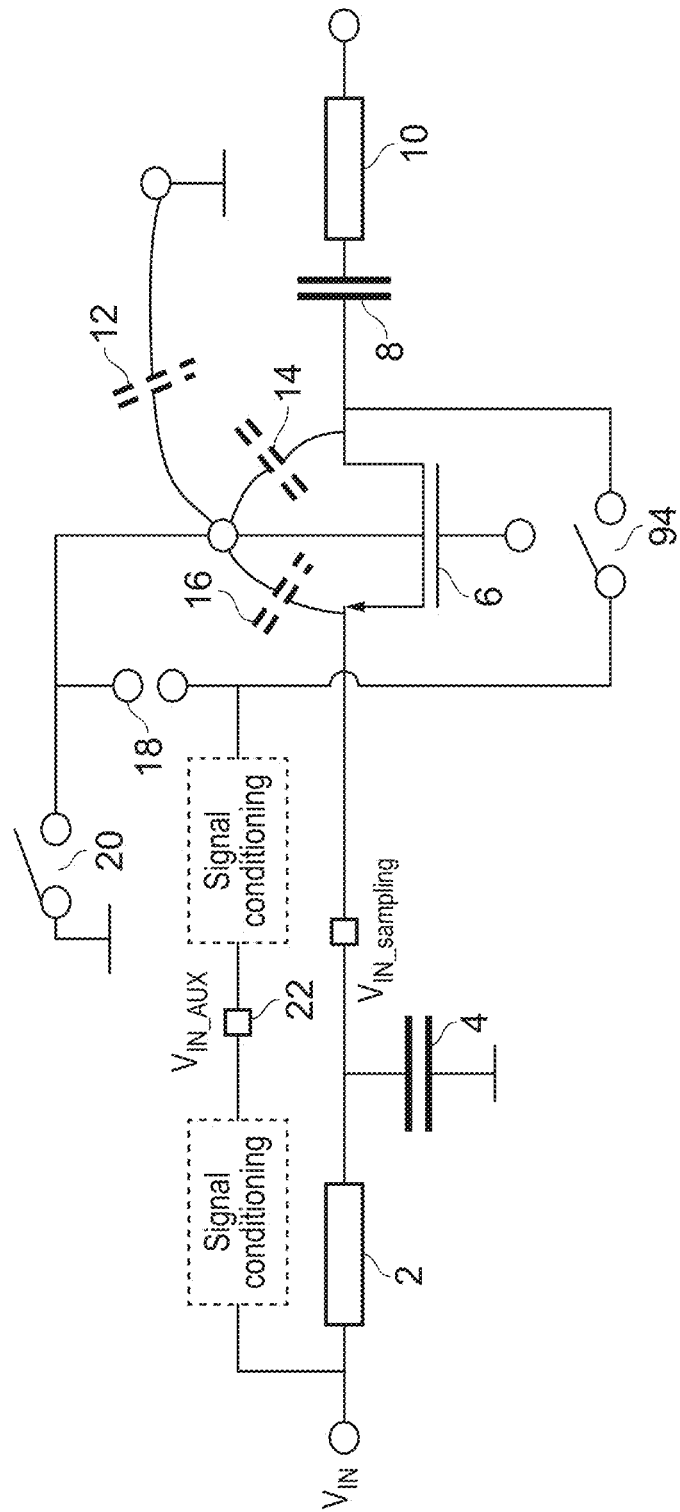
FIG. 11 is a diagram of a combined pre-charge and gate boost circuit using a common auxiliary input.
Figure 12:
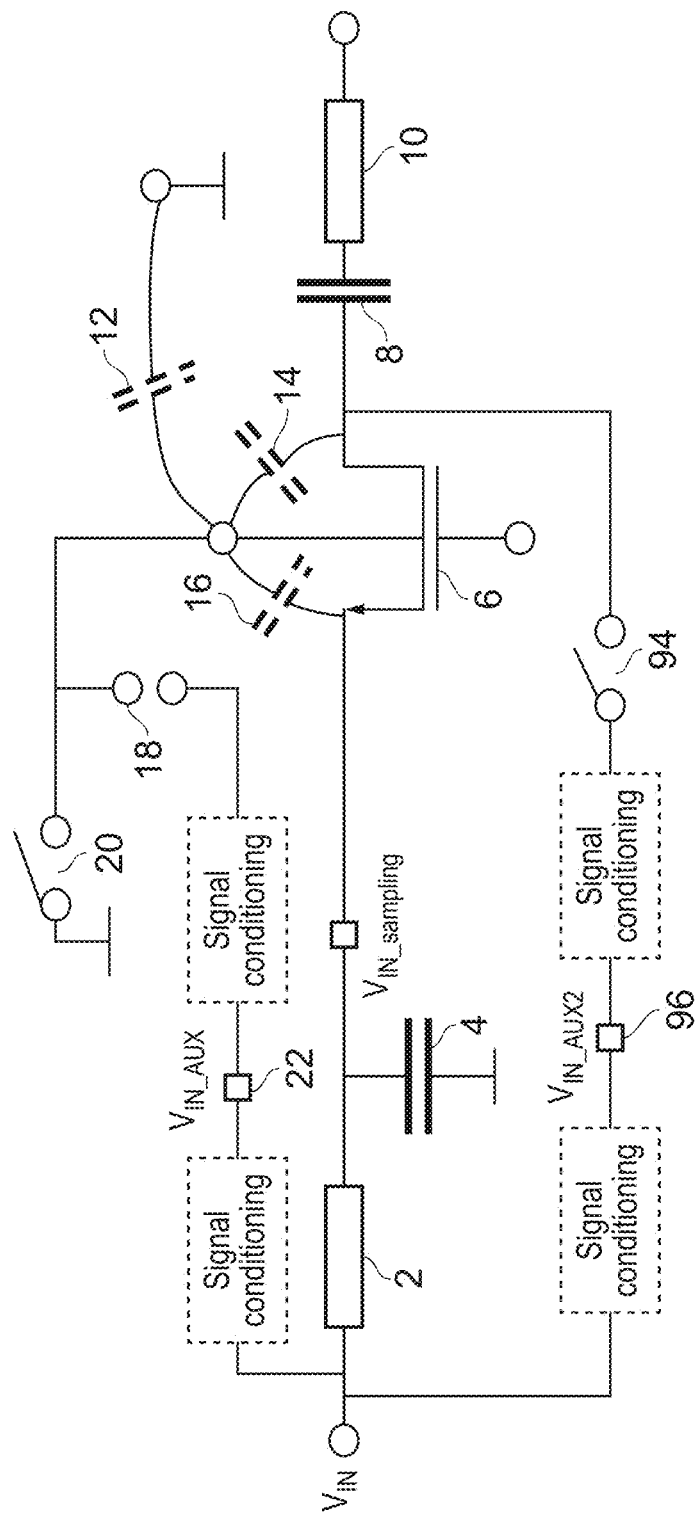
FIG. 12 is a diagram of a combined pre-charge and gate boost circuit using respective separate auxiliary inputs for the pre-charge circuitry and the gate boost circuitry.

FIG. 11 shows a further example, where the VIN_AUX input is used to provide charge to gate boost the input switch 6 whilst bypassing the RC input filter, as previously described, as well as providing charge to pre-charge the sampling capacitor, as described above. In a further variant, shown in FIG. 12, respective separate auxiliary inputs VIN_AUX and VIN_AUX2 may be used, with one of the inputs (VIN_AUX) supplying charge for the input switch 6, and the other input (VIN_AUX2) mirroring the input line and supplying pre-charge current to the sampling capacitor 8 to pre-charge the sampling capacitor prior to acquisition. Within both the examples of FIGS. 11 and 12, the input RC filter is located off chip, and a VIN_SAMPLING node is provided on one of the input pins to the chip on the primary signal line to the sampling switch, and VIN_AUX and VIN_AUX2 input nodes (as appropriate) are provided as further respective input pins to the ADC chip, Additionally, within the FIGS. 11 and 12 examples, as with the FIG. 10 example, passive signal conditioning in the form of a further RC filter may be provided on the VIN_AUX and/or VIN_AUX2 signal paths, as appropriate, in order to phase match the signal on the auxiliary path with the signal on the main sampling input path through the switch 6. Again, the passive signal conditioning may be located either on the ADC chip (i.e. the blocks shown to the right of the VIN_AUX and VIN_AUX2 input pins) or off the ADC chip at the input to the input pins (i.e the blocks shown to the left of the VIN_AUX and VIN_AUX2 input pins).

Various modifications, whether by way of addition, deletion, or substitution may be made to the above-mentioned examples to provide further examples, any and all of which are intended to be encompassed by the appended claims.

What is claimed is:

1. An input stage for a signal processing block including an analog-to-digital converter (ADC), the input stage comprising a first input node, an RC filter at its input node, and an input switch receiving an input signal to be converted at the input node, provided via the RC filter, the input stage further comprising a second input node separate from said first input node, and first circuitry arranged to bypass the RC filter to drive one or more internal loads via the second input node.

2. An input stage according to claim 1, wherein the first circuitry provides charge via the second input to the one or more internal loads in the input switch on at least a transition from conversion phase to acquisition phase of the ADC.

3. An input stage according to claim 1, wherein the first circuitry provides charge via the second input node to the one or more internal loads in the input switch during at least the acquisition phase of the ADC.

4. An input stage according to claim 1 wherein the first input node is connected to a first input pin provided on an integrated circuit package, and the second input node is connected to a second input pin on the integrated circuit package.

5. An input stage according to claim 4, wherein the integrated circuit package comprises a ball grid array type package.

6. An input stage according to claim 1, wherein the one or more internal loads are one or more parasitic capacitances, and sufficient charge is routed from the second input node to the parasitic capacitances to charge the parasitic capacitances without requiring charge to be fed to the parasitic capacitances from the first input node via the RC filter.

7. An input stage according to claim 1, wherein the bandwidth of the RC filter is smaller than would otherwise be the case if the internal loads were driven only from the first input node via the RC filter.

8. An input switch according to claim 1, wherein the input switch is a field effect transistor (FET), and at least one or more of the internal loads is a parasitic capacitance between a back gate of the FET and one or more other electrical nodes in the circuit.

9. An input stage according to claim 1, and further comprising boost circuitry arranged to feed a boost voltage to the input switch during an acquisition phase of the ADC, the boost circuitry providing the boost voltage between the input switch and the second input node.

10. An input stage according to claim 9, wherein the boost circuitry comprises a boost capacitor, and boost switching circuitry, the boost switching circuitry operating to:
   i) during a first phase, to charge the boost capacitor;
   ii) during a second acquisition phase of the ADC, connect the boost capacitor between the input switch and the second input node.

11. An input stage according to claim 9, wherein the input switch is a field effect transistor (FET), and the boost voltage is provided between the gate terminal of the FET and the second input node.

12. An input stage for an analog-to-digital converter (ADC), the input stage comprising a first input node at which in use an input signal to be converted is received, an RC filter, and an input switch receiving the input signal to be converted via the RC filter, the input stage further comprising a second input node separate from said first input node and further comprising boost circuitry arranged to feed a boost voltage to the input switch during an acquisition phase of the ADC, the boost circuitry providing the boost voltage between the input switch and the second input node.

13. An input stage according to claim 12, wherein the second input node is substantially free of the input signal received at the input node such that the boost voltage is not modulated therewith.

14. An input stage according to claim 12, wherein the boost circuitry comprises a boost capacitor, and boost switching circuitry, the boost switching circuitry operating to:
   i) during a conversion or charging phase of the ADC, connect the boost capacitor to a voltage differential to charge the capacitor; and
   ii) during the acquisition phase of the ADC, connect the boost capacitor between the input switch and the second input node.

15. An input stage according to claim 14, wherein the input switch is a field effect transistor (FET), and the boost voltage is provided between the gate terminal of the FET and the second input node.

16. An input stage for an analog-to-digital converter (ADC), the input stage comprising an input signal line having in series a first input node, a low-pass RC filter, and an input switch, the arrangement of the input signal line being such that in use the input switch receives an input signal to be converted from the input node via the RC filter, the input stage further comprising an amplifier, the amplifier having an input connected at any point on the input signal line between the input node and the input switch, and an output that in use drives one or more internal loads, the internal loads being parasitic capacitances in the input switch.

17. An input stage according to claim 16, wherein the amplifier is an operational amplifier.

18. An input stage according to claim 17, wherein the input switch is a field effect transistor (FET), and at least one or more of the parasitic capacitances are between a back gate of the FET and one or more other electrical nodes in the circuit.

19. An input stage for an analog-to-digital converter (ADC), the input stage comprising an input signal line having in series a first input node, a low-pass RC filter, an input switch, and a sampling capacitor, the arrangement of the input signal line being such that in use the input switch receives an input signal to be converted from the input node via the RC filter and outputs the input signal to the sampling capacitor to be sampled for digital conversion, the input stage further comprising a second input node separate from the first input node, and first circuitry connecting the second input node to the sampling capacitor, the arrangement being such that the second input node receives in use a pre-charge signal which is used to pre-charge the sampling capacitor without further amplification being applied to said pre-charge signal.

20. An input stage according to claim 19, and further comprising second circuitry connecting the second input node or a third input node to one or more internal loads in the input switch on at least transition from conversion phase to acquisition phase of the ADC or during acquisition phase of the ADC, the internal loads being such that they would otherwise corrupt the input signal if driven from the first input node.

* * * * *